United States Patent
Bailey et al.

(10) Patent No.: US 9,590,404 B2
(45) Date of Patent: Mar. 7, 2017

(54) HIGH CAPACITY POWER DISTRIBUTION PANEL FOR A MODULAR DATA CENTER

(71) Applicant: Dell Products, LP, Round Rock, TX (US)

(72) Inventors: Mark M. Bailey, Roound Rock, TX (US); Ty R. Schmitt, Round Rock, TX (US)

(73) Assignee: DELL PRODUCTS, LP, Round Rock, TX (US)

(*) Notice: Subject to any disclaimer, the term of this patent is extended or adjusted under 35 U.S.C. 154(b) by 0 days.

(21) Appl. No.: 15/013,485

(22) Filed: Feb. 2, 2016

(65) Prior Publication Data

US 2016/0149387 A1 May 26, 2016

Related U.S. Application Data

(63) Continuation of application No. 14/075,295, filed on Nov. 8, 2013, now Pat. No. 9,274,572.

(51) Int. Cl.
*H02G 5/00* (2006.01)
*G06F 1/18* (2006.01)
*H05K 7/14* (2006.01)

(52) U.S. Cl.
CPC ............... *H02G 5/00* (2013.01); *G06F 1/189* (2013.01); *H05K 7/1492* (2013.01); *H05K 7/1498* (2013.01)

(58) Field of Classification Search
USPC .................. 361/79, 648, 631; 174/99 B, 480
See application file for complete search history.

(56) References Cited

U.S. PATENT DOCUMENTS

| | | | | |
|---|---|---|---|---|
| 1,642,698 | A * | 9/1927 | Rohn | H02B 1/21 361/648 |
| 3,015,082 | A * | 12/1961 | Meacham | H02G 5/06 174/99 B |
| 4,082,393 | A * | 4/1978 | Gamble | H02G 5/08 439/110 |
| 4,879,624 | A | 11/1989 | Jones et al. | |
| 7,589,438 | B2 | 9/2009 | Galm | |
| 7,589,624 | B2 * | 9/2009 | Hatakeyama | G08B 13/2402 340/13.26 |
| 7,864,509 | B1 * | 1/2011 | Remmert | H02B 1/056 361/631 |

(Continued)

OTHER PUBLICATIONS

"Power Distribution in Data Centers: StarLine Track Busway, Px iPDUs and Power IQ," Raritan, Inc., 2011.

(Continued)

*Primary Examiner* — Timothy Thompson
*Assistant Examiner* — Michael F McAllister
(74) *Attorney, Agent, or Firm* — Larson Newman, LLP

(57) ABSTRACT

A power distribution network includes a first busway, a second busway situated between the first busway and a load, a first bus plug, and a second bus plug. The first and second bus plugs are configured to span across the first busway and the second busway. The first bus plug is further configured to provide power from the first busway to the load via an exit from the first bus plug that is adjacent to the load. The second bus plug is further configured to provide power from the second busway to the load via an exit from the second bus plug that is adjacent to the first load.

8 Claims, 4 Drawing Sheets

(56) References Cited

U.S. PATENT DOCUMENTS

| | | |
|---|---|---|
| 8,019,905 B2 | 9/2011 | Wu et al. |
| 8,258,412 B2 * | 9/2012 | Hayes .................... H02G 3/00 |
| | | 174/480 |
| 8,446,710 B2 | 5/2013 | Schmitt et al. |
| 2007/0291430 A1 * | 12/2007 | Spitaels ............. H01R 13/6666 |
| | | 361/79 |
| 2010/0125914 A1 | 5/2010 | Dandekar et al. |
| 2012/0184373 A1 | 7/2012 | Kim et al. |
| 2012/0200987 A1 | 8/2012 | Schmitt et al. |
| 2012/0283017 A1 | 11/2012 | Ahiska et al. |

OTHER PUBLICATIONS

"Comparing Data Center Power Distribution Architectures," N. Rasmussen et al., White Paper 129, Revision 3, Schneider Electric, 2013.

* cited by examiner

HIGH CAPACITY POWER DISTRIBUTION PANEL FOR A MODULAR DATA CENTER

CROSS REFERENCE TO RELATED APPLICATIONS

This application is a continuation of U.S. patent application Ser. No. 14/075,295, entitled "High Capacity Power Distribution Panel for a Modular Data Center," filed on Nov. 8, 2013, the disclosure of which is hereby expressly incorporated by reference in its entirety.

FIELD OF THE DISCLOSURE

This disclosure relates generally to modular data centers, and more particularly relates to a high capacity power distribution panel for a modular data center.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software resources that may be configured to process, store, and communicate information and may include one or more computer systems, data storage systems, and networking systems.

A data center operates a large number of information handling systems to provide storage and processing for smaller client systems or for other high capacity computing needs. A modular data center is a portable version of a data center that provides an easily expandable computing capacity that is quick to set up and to get operational, without having the building construction and infrastructure worries typically associated with a traditional data center. A modular data center includes a power distribution network for providing power to the information handling systems, to environmental conditioning equipment such as HVAC units and air handlers, and to other auxiliary loads.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources. In particular, while the teachings are provided in the context of a modular data center, the power needs of the modular data center are to be considered as exemplary, and the teachings can be applied to other types of power loads.

For purpose of this disclosure an information handling system can be implemented on one or more information handling system. An information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

Figure 1:
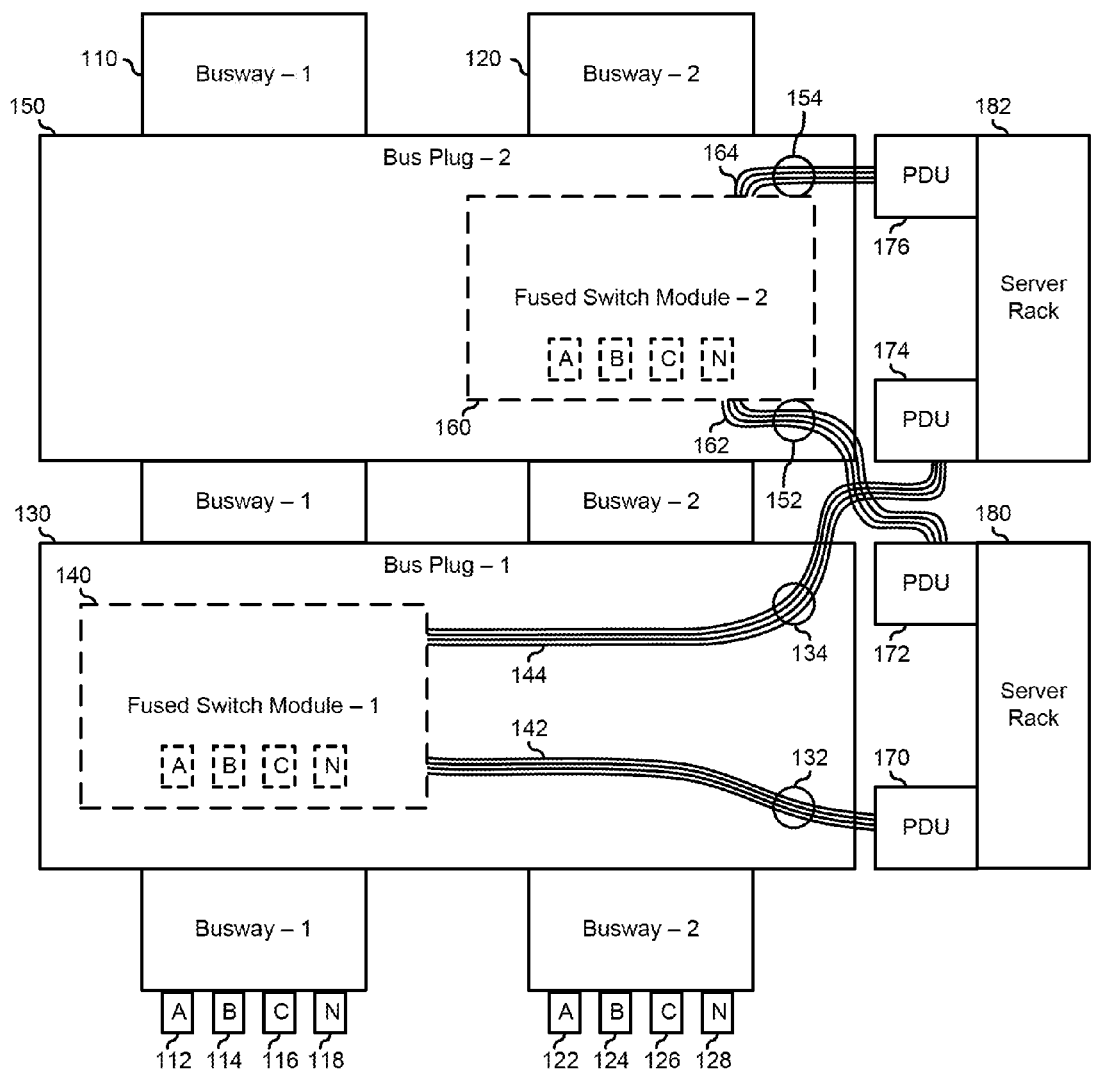
FIG. 1 is a plan view of a power distribution network according to an embodiment of the present disclosure.

FIG. 1 illustrates a plan view of an embodiment of a power distribution network 100 for a modular data center, including a first power busway (busway A) 110, a second power busway (busway B) 120, bus plugs 130 and 150, power distribution units (PDUs) 170, 172, 174, and 176, and server racks 180 and 182. Busways 110 and 120 represent large capacity power connections for the modular data center, and provide three-phase AC power for the information handling systems and environmental equipment in the modular data center. As such, busway 110 includes an A-phase conductor 112, a B-phase conductor 114, a C-phase conductor 116, and a neutral conductor 118. Similarly, busway 120 includes an A-phase conductor 122, a B-phase conductor 124, a C-phase conductor 126, and a neutral conductor 128. For example, busways 110 and 120 can provide power at 480/277 VAC, at 400/230 VAC, or at another 3-phase/single-phase voltage level, as needed or desired. In a particular embodiment, busways 110 and 120 each includes a separate ground conductor. In another embodiment, busways 110 and 120 are provided with a common ground conductor. In yet another embodiment, one or more of busways 110 and 120, PDUs 170, 172, 174, and 176, and server racks 180 and 182 are provided with a common earth ground conductor. Busways 110 and 120 can be provided with power from one or more power distribution panels (not shown), and can be used to provide balanced power loads on the modular data center, to provide power redundancy for the modular data center, or to provide power to different types of loads in the modular data center. As such, power distribution network 100 can include one or more additional busways, as needed or desired.

Bus plug 130 includes a fused switch module 140 that is connected to the three-phase power conductors 112, 114, 116, and 118, and that provides protected power to PDU 150 via conductor whip 142 and to PDU 154 via conductor whip 144. PDU 150 thus provides power from busway 110 to server rack 160, and PDU 154 provides power from busway 110 to server rack 162. Similarly, bus plug 150 includes a fused switch module 160 that is connected to the three-phase power conductors 122, 124, 126, and 128, and that provides protected power to PDU 152 via conductor whip 162 and to PDU 156 via conductor whip 164. PDU 152 thus provides power from busway 120 to server rack 160, and PDU 156 provides power from busway 120 to server rack 162. It will be understood that conductor whips 142, 144, 162, and 164 will include separate conductors to carry the A-phase, B-phase, C-phase, and Neutral power from the respective busways 110 and 120, and can include a ground conductor, as needed or desired. In a particular embodiment, power distribution network 100 is a floor mounted power distribution network and bus plugs 130 and 150 are affixed on top of busways 110 and 120. In another embodiment, power distribution network 100 is an over-head power distribution network and bus plugs 130 and 150 are affixed underneath busways 110 and 120. Server racks 180 and 182 represent one or more information handling systems for performing the computing functions of the modular data center, and can represent a power load of up to 30 kilowatt or more as needed or desired.

Bus plug 130 includes a whip exit 132 and a whip exit 134, and bus plug 150 includes a whip exit 152 and a whip exit 154. Whip exit 132 provides a hole in the enclosure of bus plug 130 through which conductor whip 142 passes to exit from the bus plug. Whip exit 132 can include a conduit fitting such that conductor whip 142 is protected and remains unexposed between bus plug 130 and PDU 170. Whip exits 134, 152, and 154 are configured similarly to whip exit 132, and permit conductor whips 144, 162, and 164, respectively, to pass through the respective bus plug 120 and 130 enclosures, and to protect the whips between the enclosures and PDUs 174, 172, and 176, respectively. Note that whip exits 132, 134, 152, and 154 are all located on an end of their respective bus plug 120 and 140 enclosures that is adjacent to PDUs 170, 172, 174, and 176, and to server racks 180 and 182. In this way, any need for additional conduit to route whips from busway 110 to server racks 180 and 182, such as via an overhead conduit, is obviated by the placement of whip exits 132 and 134 on the end of the enclosure of bus plug 130. As such, a bus plug similar to bus plug 130, that provides power from a busway, such as busway 110, that is further away from a load, such as server PDUs 170 and 174 and server racks 180 and 182, can provide a more cost effective power routing solution as compared to a routing solution that necessitates running conduit up an opposite side wall from a load, and overhead to the load. Moreover, in a confined physical space, such as is typically found in a modular data center, bus plug 130 eliminates any need to run conduits on both sides of an aisle that may be located atop power distribution network 100. As used herein, the term adjacent indicates that the load elements (i.e., PDUs 170, 172, 174, and 176, and server racks 180 and 182) are located proximately to the ends of the respective bus plugs 130 and 150 that have the whip exits 132, 134, 152, and 154, and is not necessarily indicative of a direct contact between the load elements and the bus plugs.

In the embodiment where power distribution network 100 includes one or more additional busways, the power distribution network includes one or more additional types of bus plugs, each type being associated with one of the additional busways for interconnecting between the additional busway and the load. The skilled artisan will understand that bus plugs similar to bus plugs 130 and 150 can be constructed that provide whip exits on the opposite side of the respective enclosures as illustrated in FIG. 1, so as to provide the advantages of the present disclosure when loads are arranged on the opposite side of the busways. Moreover, the skilled artisan will recognize that each enclosure can include more or less than two whip exits as illustrated, to accommodate more or less power distribution to an associated load.

Figure 2:
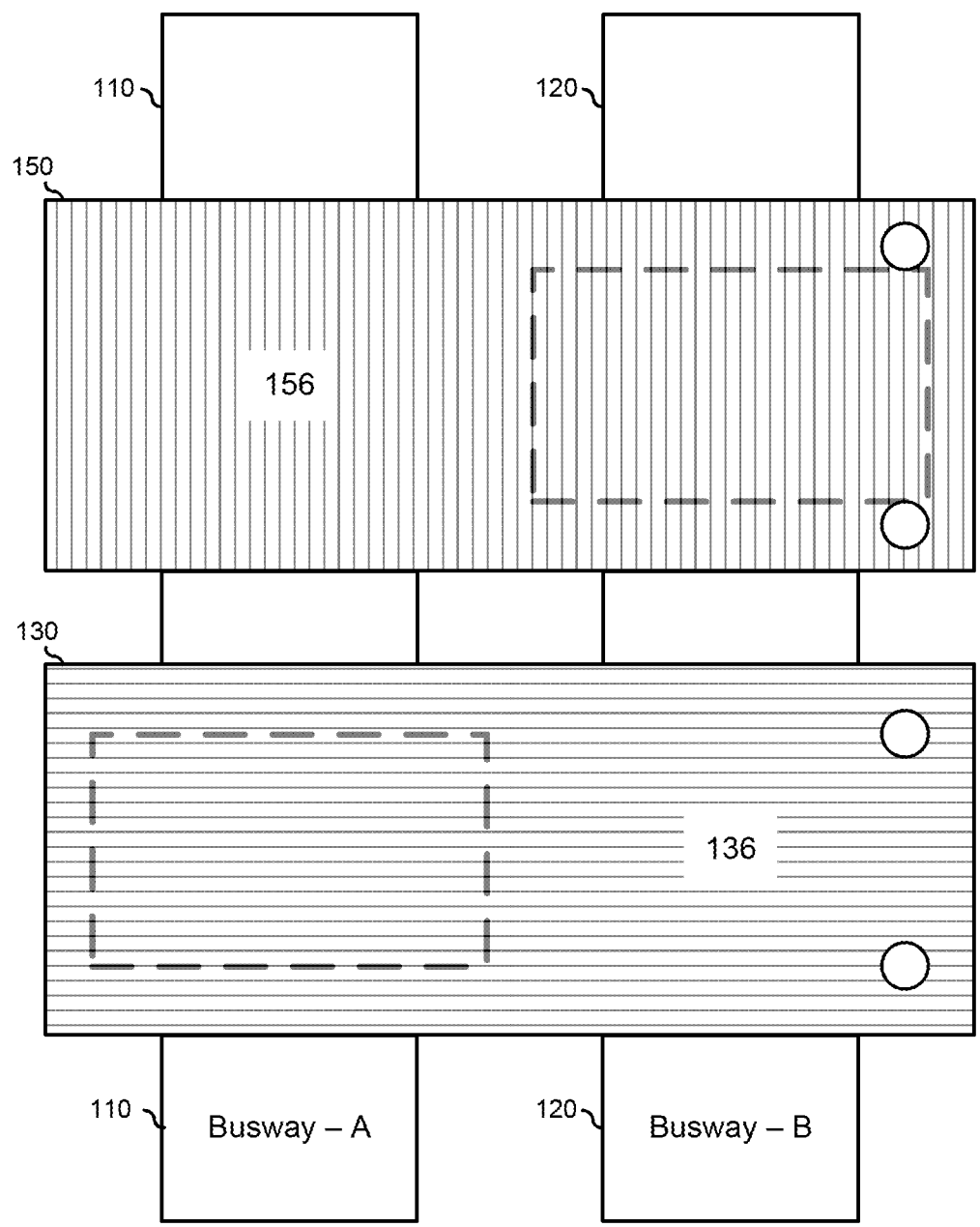
FIG. 2 is an exterior view of the power distribution network of FIG. 1.

FIG. 2 illustrates an exterior view of power distribution network 100. Here, the cover of bus plug 130 is provided with an exterior marking 136 and the cover of bus plug 150 is provided with an exterior marking 156. In a particular embodiment, exterior marking 136 is different from exterior marking 156. In this way, service personnel can recognize exterior marking 136 and quickly determine that bus plug 130 provides power from busway 110, and can recognize exterior marking 156 and quickly determine that bus plug 150 provides power from busway 120. In a particular embodiment, exterior markings 136 and 156 differ by virtue of a color of the cover or of the enclosure of the respective bus plugs 130 and 150. In another embodiment, exterior markings 136 and 156 differ by virtue of a representation of locations of respective fused switch modules 140 and 160. In yet another embodiment, exterior markings 136 and 156 differ by virtue of a number or letter associated with busway 110 and 120. In the embodiment where power distribution network 100 includes one or more additional busways and one or more additional types of associated bus plugs, each type of bus plug can have a different exterior marking, such as an additional color, an additional representation of a location of a fused switch module, or an additional number or letter associated with the additional busway.

Figure 3:
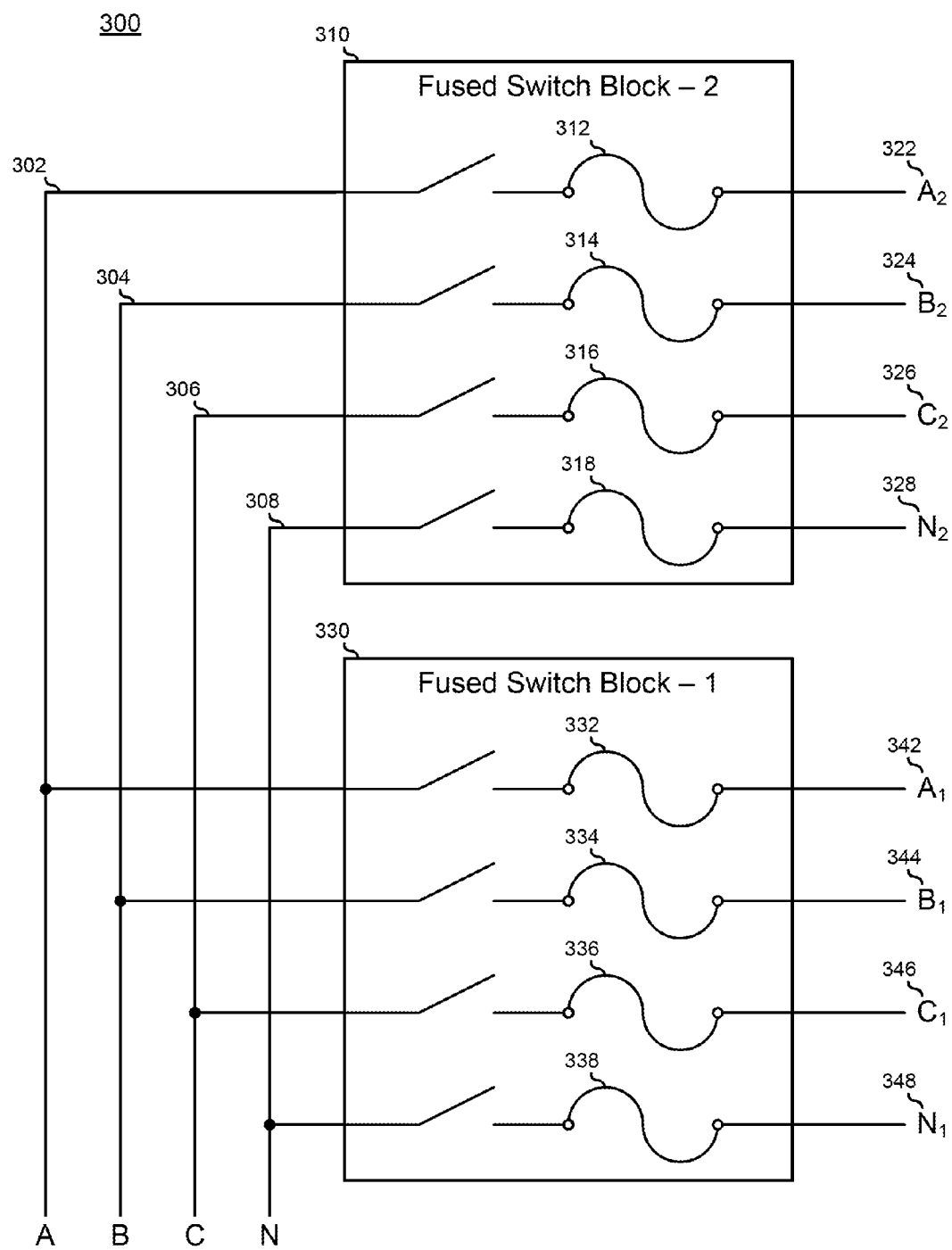
FIG. 3 is a schematic diagram of a fused switch module in a power distribution network according to an embodiment of the present disclosure.

FIG. 3 illustrates an embodiment of a fused switch module 300 similar to fused switch modules 140 and 160. Fused switch module 300 includes a fused switch block 310 and a fused switch block 330. Fused switch block 310 includes an A-phase fused switch 312, a B-phase fused switch 314, a C-phase fused switch 316, and a neutral fused switch 318. Similarly, fused switch block 330 includes an A-phase fused switch 332, a B-phase fused switch 334, a C-phase fused switch 336, and a neutral fused switch 338. Inputs of A-phase fused switches 312 and 332 are connected together to an A-phase conductor of a busway similar to busways 110 or 120, inputs of B-phase fused switches 314 and 334 are connected together to a B-phase conductor of the busway, inputs of C-phase fused switches 316 and 336 are connected together to a C-phase conductor of the busway, and inputs of neutral fused switches 318 and 338 are connected together to a neutral conductor of the busway. Outputs of fused switches 312, 314, 316, and 318 are connected to respective A-phase 322, B-phase 324, C-phase 326, and neutral 328 conductors of a conductor whip similar to conductor whips 142 and 162. Similarly, outputs of fused switches 332, 334, 336, and 338 are connected to respective A-phase 342, B-phase 344, C-phase 346, and neutral 348 conductors of a conductor whip similar to conductor whips 144 and 164. In a particular embodiment, each of fused switch blocks 310 and 330 provide fault resiliency of greater than 100 kilo-amps inrush current (kAIC), as measured at the inputs to the fused switch blocks, while limiting output currents to less than 10 kAIC.

Figure 4:
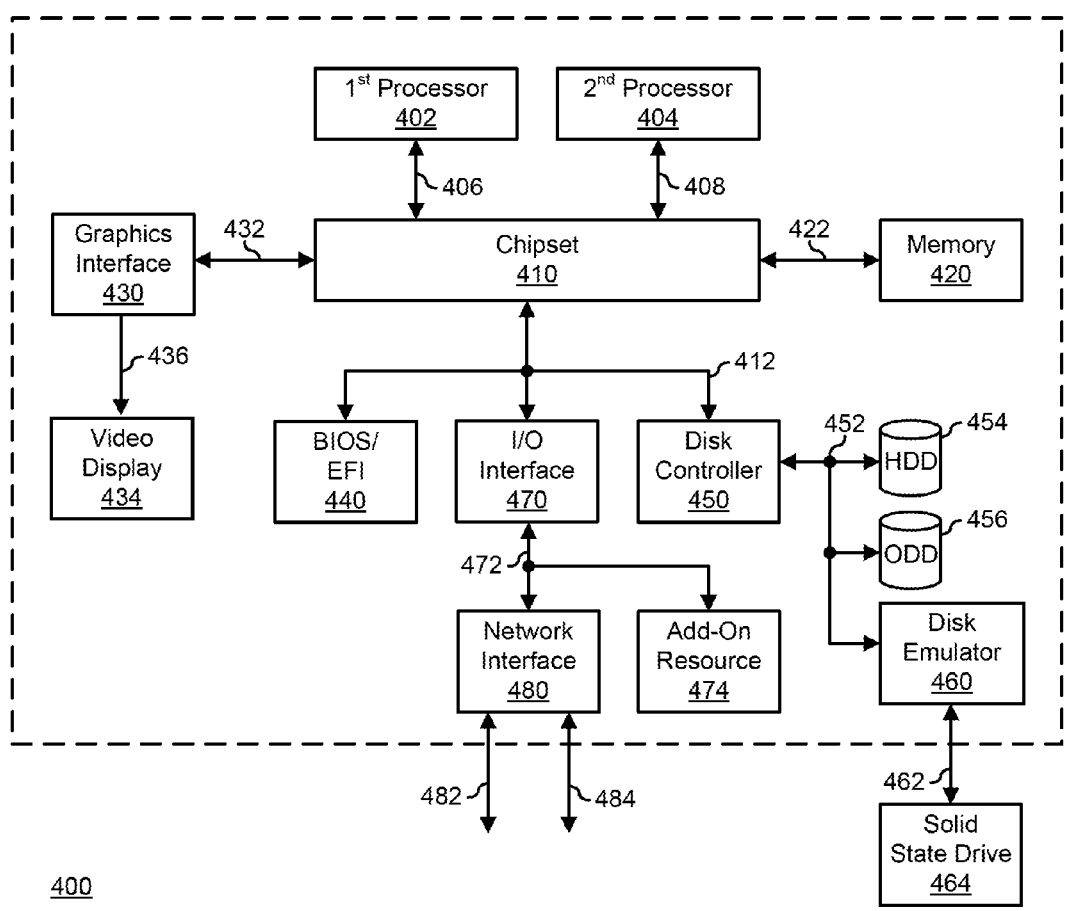
FIG. 4 is a block diagram illustrating a generalized information handling system according to an embodiment of the present disclosure.

FIG. 4 illustrates a generalized embodiment of information handling system 400. For purpose of this disclosure information handling system 400 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described above, and operates to perform one or more of the methods described above. Information handling system 400 includes a processors 402 and 404, a chipset 410, a memory 420, a graphics interface 430, include a basic input and output system/extensible firmware interface (BIOS/EFI) module 440, a disk controller 450, a disk emulator 460, an input/output (I/O) interface 470, and a network interface 480. Processor 402 is connected to chipset 410 via processor interface 406, and processor 404 is connected to the chipset via processor interface 408. Memory 420 is connected to chipset 410 via a memory bus 422. Graphics interface 430 is connected to chipset 410 via a graphics interface 432, and provides a video display output 436 to a video display 434. In a particular embodiment, information handling system 400 includes separate memories that are dedicated to each of processors 402 and 404 via separate memory interfaces. An example of memory 420 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 440, disk controller 450, and I/O interface 470 are connected to chipset 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 440 includes BIOS/EFI code operable to detect resources within information handling system 400, to provide drivers for the resources, initialize the resources, and access the resources. BIOS/EFI module 440 includes code that operates to detect resources within information handling system 400, to provide drivers for the resources, to initialize the resources, and to access the resources.

Disk controller 450 includes a disk interface 452 that connects the disc controller to a hard disk drive (HDD) 454, to an optical disk drive (ODD) 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits a solid-state drive 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O interface 470 includes a peripheral interface 472 that connects the I/O interface to an add-on resource 474 and to network interface 480. Peripheral interface 472 can be the same type of interface as I/O channel 412, or can be a different type of interface. As such, I/O interface 470 extends the capacity of I/O channel 412 when peripheral interface 472 and the I/O channel are of the same type, and the I/O interface translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as chipset 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A bus plug for a power distribution network, the bus plug comprising:
   a first conductor whip coupled between a first busway and a first load; and
   a first route from the bus plug;
   wherein the bus plug is configured to span across the first busway and a second busway, the second busway being situated between the first busway and the first load; and
   wherein the first route is adjacent to the first load.

2. The bus plug of claim 1, further comprising:
   a second conductor whip coupled between the first busway and a second load; and
   a second route from the bus plug;
   wherein the second route is adjacent to the second load.

3. The bus plug of claim 1, wherein:
   the first busway provides three-phase alternating current power; and
   the first conductor whip provides the three-phase alternating current power to the first load.

4. The bus plug of claim 1, wherein the bus plug is further configured to span across a third busway, the third busway being situated between the second busway and the first load.

5. The bus plug of claim 1, further comprising:
   a fused switch module configured to couple the power from the first busway to the first conductor whip.

6. The bus plug of claim 5, wherein the fused switch module provides fault resiliency of greater than 100 kiloamps inrush current to the first load.

7. The bus plug of claim 5, wherein a surface of the bus plug is marked to identify a location of the fused switch module.

8. The bus plug of claim 1, wherein a surface of the bus plug is marked to identify the bus plug as receiving power from the first bus way and not the second busway.

\* \* \* \* \*